United States Patent
Putter

(10) Patent No.: US 7,378,997 B2
(45) Date of Patent: May 27, 2008

(54) METHOD OF REDUCING INTER-SYMBOL INTERFERENCE, A SIGMA-DELTA CONVERTER FOR PERFORMING THIS METHOD AND A STORAGE MEDIUM CONVEYING INFORMATION GENERATED BY THIS METHOD

(75) Inventor: Bas Maria Putter, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 10/594,488

(22) PCT Filed: Mar. 23, 2005

(86) PCT No.: PCT/IB2005/050990

§ 371 (c)(1),
(2), (4) Date: Sep. 27, 2006

(87) PCT Pub. No.: WO2005/093959

PCT Pub. Date: Oct. 6, 2005

(65) Prior Publication Data

US 2007/0200742 A1 Aug. 30, 2007

(30) Foreign Application Priority Data

Mar. 29, 2004 (EP) ................................. 04101293

(51) Int. Cl.
*H03M 1/06* (2006.01)

(52) U.S. Cl. ..................................... 341/118; 341/143

(58) Field of Classification Search ................ 341/143, 341/155, 118, 144, 120
See application file for complete search history.

(56) References Cited

U.S. PATENT DOCUMENTS

| | | | | |
|---|---|---|---|---|
| 5,357,196 | A * | 10/1994 | Ito | 324/166 |
| 6,043,853 | A * | 3/2000 | Shimazaki et al. | 348/625 |
| 6,078,622 | A * | 6/2000 | Boytim et al. | 375/257 |
| 6,351,229 | B1 | 2/2002 | Wang | |
| 6,356,129 | B1 * | 3/2002 | O'Brien et al. | 327/175 |
| 6,757,300 | B1 * | 6/2004 | Pages et al. | 370/493 |
| 6,952,174 | B2 * | 10/2005 | Madsen et al. | 341/63 |
| 6,972,704 | B2 * | 12/2005 | Rivoir | 341/143 |

OTHER PUBLICATIONS

Norsworthy S. R. et al: "Delta-Sigma Converters, Theory, Design and Simulation"; IEEE Press, New York; 1997 pp. 260-264.

* cited by examiner

*Primary Examiner*—Peguy JeanPierre
(74) *Attorney, Agent, or Firm*—Peter Zawilski

(57) ABSTRACT

A method and arrangement of reducing inter-symbol interference occurring at the digital to analog conversion of a one bit digital signal is provided. During the generation of the one-bit digital signal in a sigma-delta converter the edge-density of the digital signal is measured, the result of the measurement is multiplied with the digital signal and the result of the multiplication is added to the input of the quantizer generating the digital signal. The invention also covers storage media comprising a one-bit digital signal generated in accordance with the invention.

Figure 1:
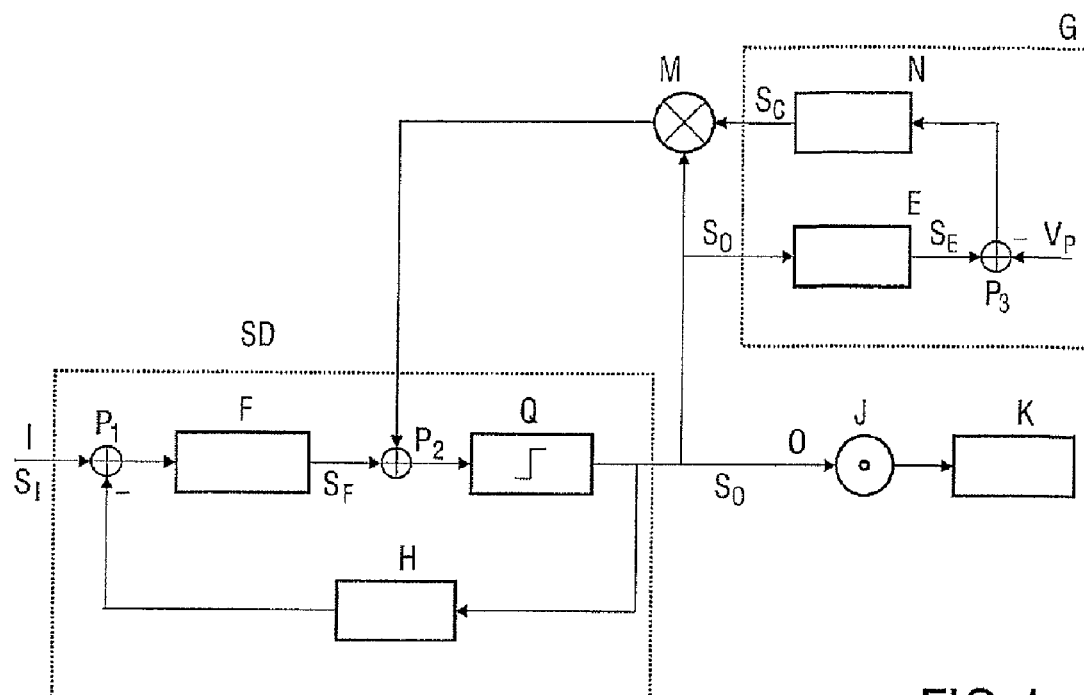

7 Claims, 2 Drawing Sheets

METHOD OF REDUCING INTER-SYMBOL INTERFERENCE, A SIGMA-DELTA CONVERTER FOR PERFORMING THIS METHOD AND A STORAGE MEDIUM CONVEYING INFORMATION GENERATED BY THIS METHOD

The invention relates to a method of reducing inter-symbol interference occurring at the digital to analog conversion of a one-bit digital signal stream.

With a one-bit DA-converter a highly linear digital to analog conversion can be obtained, where it not for the inter-symbol interference (ISI) which distortion is caused by the DA converter. Inter-symbol interference occurs when the actual analog output of the DA-converter is not only dependent on the actual digital input code but also on previous digital input code. The result of this "memory" effect is that components not present in the digital input-code occur in the analog output of the DA-converter.

Inter-symbol interference may e.g. be caused by the parasitic capacitance of the switched reference (e.g. current source) of the DA-converter and by the DC-offset of the operational amplifier to which the switched reference is supplied, with the result that an unavoidable extra charge packet is dumped to the output every time the DA-converter switches. When the digital signal is a one-bit digital signal stream, the DA-converter that returns the signal in analog form, switches a lot during the zero crossings of the signal and less in the signal peaks. Because one period of a sine wave has two zero-crossings and two peaks, the extra charge packets represent even (second) order distortion.

In some cases the DA-converter loads its reference with the result that the reference itself contains even (second) order components. This second order signal on the DA-reference is multiplied with the input code resulting in an odd (third) harmonic distortion at the output of the DA-converter.

A prior art method to reduce the inter-symbol interference is to switch the DA reference on during part of the clock period and off during the other part of the clock period. The extra charge packets are then present during every clock period, making their contribution a DC-signal in the output of the DA-converter. Drawbacks of this method are that the output signal of the DA-converter is less so that it must be increased to obtain the same output level, that switching costs power so that extra switching means extra power consumption and that the circuitry following the DA-converter must be able to deal with a "choppy" input signal. Also susceptibility to timing jitter increases.

The present invention provides a method that does not show these drawbacks and the method of reducing inter-symbol interference according to the invention, in which the generation of said one-bit digital signal stream comprising the steps of converting an input signal to said one-bit digital signal stream with a sigma-delta configuration of a low pass filter having an output coupled to the input of a quantizer whose output is fed back to the input of the low pass filter, is therefore characterized by generating a control signal that is representative of the density of the edges of the one-bit digital signal stream at the output of the quantizer, multiplying the control signal with said one-bit digital signal stream and applying the result of the multiplication together with the output of the low pass filter to the input of the quantizer. The invention provides a method to substantially reduce the edges of the one-bit digital signal stream during the zero crossings of the signal, thereby more evenly distributing the edges and thus reducing the signal content of the inter-symbol interference. It may be noted that in the prior art method mentioned above the inter-symbol interference reduction is done in the DA-conversion i.e. after the generation of the one-bit digital signal stream, with all the drawbacks mentioned earlier. In contradistinction therewith, in accordance with the present invention, controlling the generation itself of the one-bit digital stream does the reduction of the inter-symbol interference.

The U.S. Pat. No. 6,351,229 shows a sigma-delta converter in which, signal dependent, a pseudo random sequence is added to the input of the quantizer. This method is intended to avoid interference tones that would otherwise occur due to the regular character of the bit sequence generated by the converter and it does not substantially reduce the density of the edges in this sequence.

It is also known to reduce the edges of pulse-width modulated signals which are intended to be applied to class D power amplifiers. Because in the class D amplifier each edge dissipates a certain amount of energy it is of importance to keep the number of edges as small as possible. However this known method may either cause substantial audio distortion or requires complicated digital circuitry.

The method and arrangement according to the invention generates substantially less audio distortion and/or is easier to implement. Moreover the method and arrangement according to the invention are especially useful to reduce the edges at the very start of the digital traject i.e. during the analog to digital conversion of the signals. These reduced-edge signals may then conveniently be recorded in single bit digital format on a storage medium.

The invention further provides a one-bit sigma-delta converter for converting an input signal to a one-bit digital signal stream, said converter comprising a quantizer with an input and an output, a low pass filter whose output is coupled to the input of the quantizer and whose input is coupled to the output of the quantizer, thereby constituting a feedback-arrangement with the quantizer, means to supply the input signal to the feedback arrangement and means to derive the one-bit digital signal stream from the output of the quantizer, which converter is characterized by an edge-density controller connected to the output of the quantizer for providing a control signal indicative of the density of the edges of the one-bit digital signal stream, a multiplier for multiplying said control signal with the one-bit digital signal stream of the quantizer and means for applying the output of the multiplier to the input of the quantizer.

The one-bit sigma-delta converter according to the present invention may be further characterized in that the edge-density controller comprises an edge-extractor connected to receive the one-bit digital signal stream of the quantizer, and a second low pass filter receiving the output signal of the edge-extractor and providing said control signal. The second low pass filter suppresses the inter-symbol interference in the frequency band of interest and shapes this interference to higher frequencies, just as the usual low pass filter of the sigma-delta modulator suppresses the quantization noise in the frequency band of interest and shapes this noise to higher frequencies. As is the case with the low pass filter of the sigma delta modulator, the second low pass filter gives more suppression of the interference if the order of the filter is higher.

The one-bit sigma-delta converter according to the present invention may be still further characterized by a reference signal source connected to the second low pass filter for referencing the level of the control signal. The reference signal allows controlling the inter-symbol interference reduction that may be achieved. The reference signal may be a DC-value of either positive or negative value. The reference signal may also contain a time-dependent component. The reference signal may be either added to the input or to the output or to somewhere in-between the input and output of the second low pass filter.

A simple implementation of a one-bit sigma-delta converter according to the invention is characterized in that the second low pass filter is an integrator and that the reference signal is applied with a polarity opposite to that of the edge-extractor pulses to the input of the integrator. In this configuration any edge in the digital bit-stream of the quantizer causes an increase in the control signal and any absence of an edge causes a decrease of the control signal. The end result is that the ratio between the amplitude of the edge-extractor pulses and the amplitude of the reference signal determines the ratio between the clock-periods without edges and the clock-periods with edges, independent of whether the input signal to the converter is in a peak value or in a zero crossing.

It may apparent that preferably the edge extractor extracts all the edges of the digital bit-stream. However, the extractor may also extract only a part of the edges e.g. only the rising edges or only the falling edges. Then the reference signal should be adapted accordingly.

As already mentioned earlier the main advantage of the present invention is to more evenly distribute the edges over the clock periods of the digital output signal. This results in a substantial reduction of the inter-symbol interference in the frequency band of interest. An aspect that has to be taken into consideration is the inherent reduction of the maximum input signal level of the converter caused thereby. Because edges are added to the digital signal during the extreme values of the signal, the maximum input signal level with respect to full scale is reduced. In order to limit this reduction of the maximum input level the setting of the invented converter, especially of the reference signal mentioned earlier, is preferably so that the mean number of the clock periods comprising an edge is less than 40%. Whereas usually a one-bit digital signal generated by prior art sigma delta converters comprises an edge in about 65% of the clock periods, digital output signals generated in accordance with the present invention may preferably have an edge in about 20% of the clock periods. It may be noted that the present invention also covers a storage medium having stored thereon at least one signal track in one-bit digital stream format and which is characterized in that the number of clock periods comprising an edge in the one-bit digital stream of said signal track is less than 40% of the total number of clock periods of the one-bit digital stream of said signal track. In this application the term "signal track" shall mean an audio- or video-signal of at least one minute duration. When the program is read from this storage medium, the inter-symbol interference occurring during the digital to analog conversion of the one-bit digital stream is substantially less than the inter-symbol interference occurring during the digital to analog conversion of the one-bit digital stream from a prior art storage medium.

It has to be noted that the one-bit digital stream, prior to being written on the storage medium, may be subjected to a coding step in order to better accommodate the signal to the writing process. The corresponding decoding takes place while the storage medium is read out and prior to the DA-conversion of the signal. In this case the advantages of the present invention are still maintained because not the edges on the storage medium but the edges applied to the DA converter are the cause of the inter-symbol interference. Moreover, if said coding step serves to compress the signal stored on the storage medium, the compression itself will be improved by the reduction of the edges in the signal to be compressed.

A one-bit digital signal has the advantage of optimal linearity because only one reference (current source) is involved in the DA-conversion of such signal. The main disadvantage of a one-bit digital signal however is the large amount of quantization noise that is involved in the generation of the signal. The amount of quantization noise is substantially minimized if a multi-bit digital signal is used. The problem with a multi-bit digital signal is that a plurality of references is needed for the DA conversion and any inequality between these references leads to non-linear distortion of the analog signal.

A substantial reduction of the non-linear distortion is obtained by Dynamical Element Matching, which is a known algorithm to use each of a plurality of references for the DA-conversion of each of the values of the signal. From Norsworthy S. R. and Schreier R. and Temes G. C. Delta-Sigma Converters, Theory, Design and Simulation. IEEE Press, New York, 1997 pp 260-264 it is known that in the implementation of such algorithm a multi-bit sigma-delta converter may be used comprising a plurality of interconnected one-bit sigma-delta converters each with a low pass filter in feedback arrangement with one of a plurality of interconnected quantizer means, means to supply the input signal to said plurality of quantizer means and means to derive the multi-bit digital signal from the outputs of the plurality of quantizer means. In accordance with a further aspect of the present invention such multi-bit sigma-delta converter may be characterized in that each of the outputs of the plurality of quantizer means is connected to an edge detector for providing a control signal indicative of the edges of the one-bit digital stream at said output, a multiplier for multiplying said control signal with the one-bit digital stream of said output and means for applying the result of the multiplication to the respective input of the quantizer means.

The invention will be described with reference to the accompanying figures.

Figure 2:
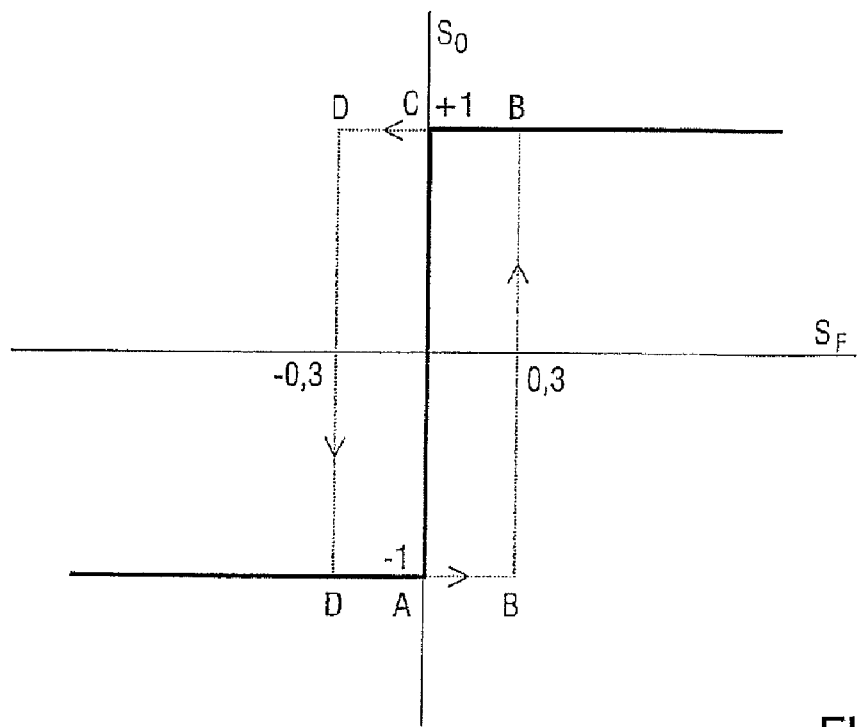
Figure 3:
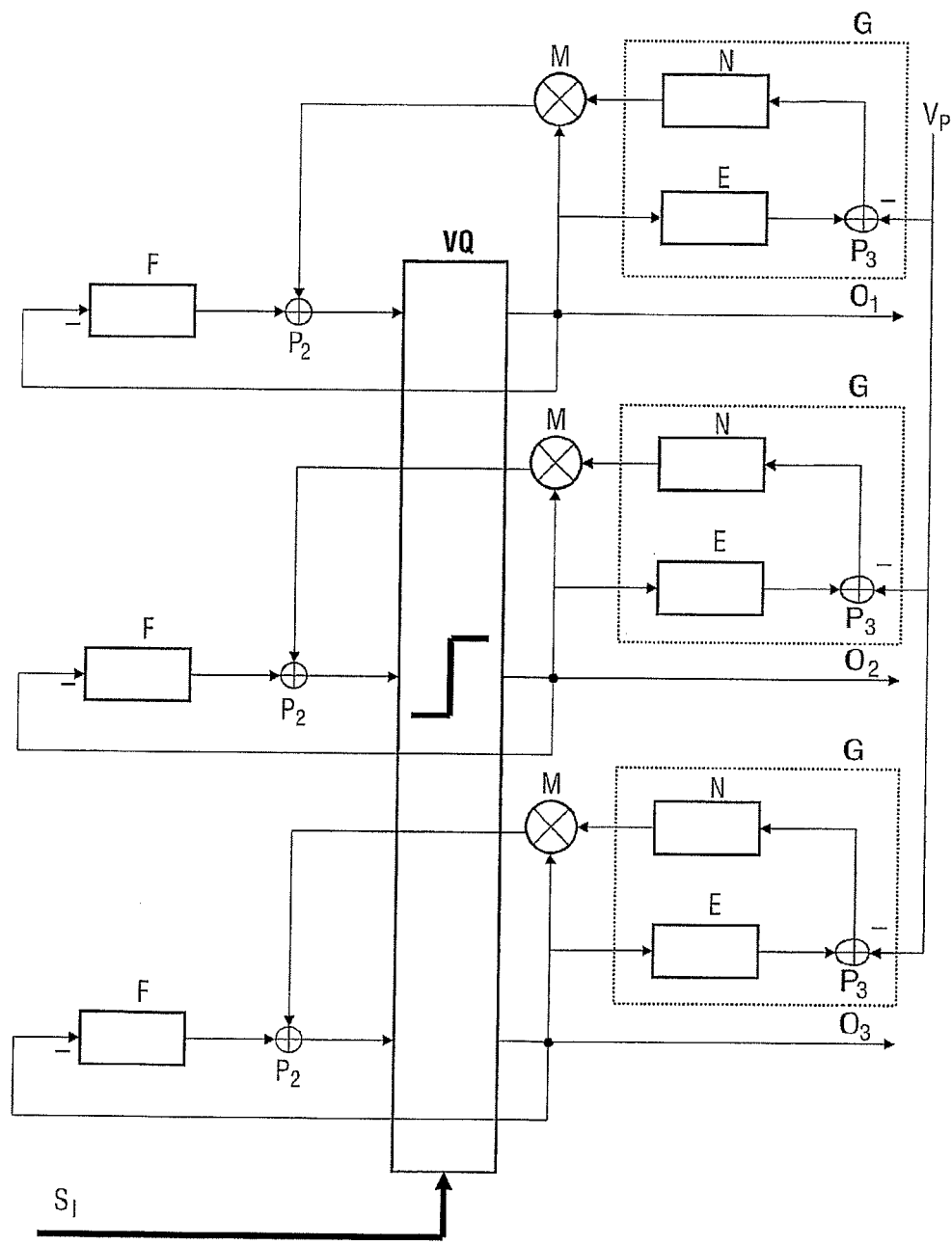

Herein shows:

FIG. 1 a one-bit sigma-delta converter in accordance with the present invention, FIG. 2 a graph for explaining the operation of the one-bit sigma-delta converter in accordance with the present invention and FIG. 3 an example of a multi-bit sigma-delta converter in accordance with the present invention.

The one-bit sigma-delta converter of FIG. 1 comprises a sigma-delta modulator SD with an analog signal input I and a digital signal output O. An analog signal $S_I$ at the input I is applied through an addition point $P_1$ to an analog low pass filter F and the filtered signal $S_F$ is applied, through a second addition point $P_2$, to a one-bit clock controlled quantizer Q which in this case may be in the form of a simple clock controlled comparator. Each time, when during a clock pulse the input signal to the quantizer exceeds a predetermined reference level ("zero"), the quantizer generates a +1 pulse and when this signal remains below said predetermined level the quantizer generates a −1 pulse. The one-bit digital output pulses $S_O$ from the quantizer Q are transformed into analog pulses in a DA-converter H and subtracted from the analog input signal $S_I$ in addition point $P_1$. The well known result of this sigma-delta configuration is a lot of +1 pulses in the output signal $S_O$ when the input signal $S_I$ is maximal positive, a lot of −1 pulses when the input signal is maximal negative and alternating +1 pulses and −1 pulses when the input signal is at or near zero. If the sigma-delta modulator is properly designed, the quantization noise generated by the quantizer is shaped to the frequency band between the frequency band of the input signal and half the clock frequency. To have sufficient space for the quantization noise the clock frequency should therefore be chosen sufficiently high.

In particular the large amount of edges in the output signal $S_O$ during the zero crossings of the input signal is a serious source of inter-symbol interference, not only in the DA converter H in the feedback path of the sigma-delta modulator M but also in any DA converter which has to convert the digital output signal $S_O$ back into the analog format. In order to reduce the large amount of edges especially during the zero-crossings of the input signal, the arrangement of FIG. 1 comprises an edge-extractor E whose input receives the output signal $S_O$ of the sigma-delta modulator. The edge-extractor produces, for the duration of one clock-period, a signal $S_E$, which is "high" when the signal $S_O$ has changed during the previous clock period and a "low" when this signal has not changed during the previous clock period. The edge-extractor E may e.g. comprise a XOR-gate with two inputs, one of which receives the signal $S_O$ directly and the other receives the signal $S_O$ through a clock-controlled D-flip-flop. The signal $S_E$, which may be treated as an analog signal with for instance "high"=1 Volt and "low"=0 Volt, is subsequently applied to an addition point $P_3$ where a reference voltage $V_P$ of e.g. 0.2 Volt is subtracted from the signal $S_E$. The result of the subtraction $S_E - V_P$ is 0.8 Volt when an edge has occurred during the previous clock period and −0.2 Volt when no edge has occurred during this period. Or, with other words, the mean value of the signal $S_E - V_P$ will be zero when an edge occurs in 20% of the clock periods, positive when an edge occurs in more than 20% of the clock periods and negative when an edge occurs in less than 20% of the clock periods.

An integrator N receives the signal $S_E - V_P$ and produces a control signal $S_C$ which rises in value when in the output signal $S_O$ edges occur in more than 20% of the clock periods and which falls in value when edges occur in less than 20% of the clock periods. The control signal $S_C$ is multiplied in a multiplier M with the one-bit signal $S_O$ from the sigma-delta modulator and the output signal $S_O \times S_C$ of the multiplier is added to the output of the filter F in the second addition point $P_2$.

The operation of the combination of quantizer Q, multiplier M and addition point $P_2$ is explained with reference to the diagram of FIG. 2. This diagram shows on the vertical axis the output value $S_O$ of the quantizer (+1 or −1) and on the horizontal axis the value of the output signal $S_F$ of the low pass filter F. The values given below are only by way of example and relative to the value of the output pulses.

If the control signal $S_C$ is zero also the output of the multiplier M is zero and the quantizer output $S_O$ will switch between the points A and C of FIG. 2 under the control of small variations of he filter output signal SF. This is depicted in FIG. 2 by the thick lines.

However, now assume that the edge-density controller G delivers a control signal $S_C$ of value 0.3.
a. When the quantizer output signal $S_O = -1$ (and the filter output signal $S_F$ is substantially zero) the multiplier M delivers a signal $S_O \times S_C = -0.3$ to the quantizer and the quantizer status remains unchanged (at point A in FIG. 4). Even when the filter output signal $S_F$ changes by small amounts, the multiplier output of −0.3 will keep the output of $P_2$ negative so that the status of the quantizer remains unchanged.
b. Only when the filter signal $S_F$ increases to $S_F = +0.3$ the output of addition point $P_2$ increases to 0 and the quantizer output switches to +1. The multiplier output becomes $S_O \times S_C = 0.3$ and the output of $P_2$ further increases to $S_F + S_O \times S_C = 0.3 + 0.3 = 0.6$ (point B).
c. This quantizer status is again maintained when the filter signal $S_F$ decreases to e.g. zero (point C of FIG. 2) or even when the filter signal decreases to −0.25.
d. Only when the filter signal SF decreases to −0.3 the output of addition point $P_2$ decreases to 0 and the quantizer Q switches to $S_O = -1$, the multiplier output becomes $S_O \times S_C = -0.3$ and the output of $P_2$ further decreases to −0.6 (point D).

From the above it is apparent that the switching behavior of the quantizer is subject to hysteresis and highly reduced by the positive value of the control signal $S_C$. Only when the value of the filter signal $S_F$ comes above the value 0.3 or below the value −0.3, the quantizer will switch and an edge will occur in the output of the quantizer. The larger the value of the control signal $S_C$ is, the larger the value of the filter signal $S_F$ should be for the quantizer to switch.

On the other hand it may easily be seen that when the control signal $S_C$ is negative, the quantizer Q will switch easily at half the clock frequency even when the filter signal $S_F$ is zero. In this case the quantizer Q, the multiplier M and the addition point $P_2$ together constitute an oscillator, which generates an edge at each clock pulse. However this large amount of edges will soon led to the built-up of a positive value of the control signal $S_C$ so that the number of edges is strongly reduced by the mechanism described above.

The control circuit with the edge-density controller G and the multiplier M limits the number of edges in the digital output signal $S_O$ to a certain mean value. In the arrangement of FIG. 1 this mean value can be easily found because the mean value of the input signal to the integrator N has to be zero (otherwise the output signal $S_C$ of the integrator would steadily rise or fall). When for instance the value of the signal $S_E$ is 1 in case of an edge and 0 in case of no edge and when the value of the reference voltage $V_P$ is 0.2 then, because the signal $S_E - V_P$ to the integrator N should necessarily have zero DC-component, the signal $S_E$ will have 20% clock periods with $S_E = 1$ and 80% clock periods with $S_E = 0$. Consequently the control circuit has reduced the number of edges so that edges occur only in 20% of the clock periods. For more edges the reference voltage $V_P$ has to be increased and for less edges this voltage should be chosen lower.

The influence of the control circuit on the maximum input signal level of the converter may be illustrated as follows:

Suppose that the reference voltage $V_P$ is set so that the output signal of the converter has an edge in 20% of the clock periods. Then this signal may contain the following cycles of ten clock periods:
a. When the input signal to the converter is extreme positive: +1, +1, +1, −1, +1, +1, +1, +1, +1, +1. This cycle has two edges in 10 clock periods so that the number of clock periods having an edge is 20%. The value of the output signal is 9*+1+1*−1=8 that is 8/10=80% of maximal so that the maximum input signal level has been reduced to 80% of full scale.
b. When the input signal to the converter is zero: −1, −1, +1, +1, +1, +1, +1, −1, −1, −1. The cycle has again 2 edges in 10 clock periods so that the number of edges having an edge is again 20%. The output is 5*+1+5*−1=0
c. When the input signal is extreme negative: −1, −1, +1, −1, −1, −1, −1, −1, −1, −1. The cycle has again two edges in 10 clock periods so that the number of clock periods having an edge is 20%. The value of the output signal is 9*−1+1*+1=−8, which is again 80% of maximal negative so that the maximum input level has been reduced to 80% of full scale.

As a comparison it is presumed that the setting of the converter is so that edges occur in 50% of the clock periods: Then the following cycles may be generated:

a. When the input signal to the converter is extreme positive: +1, −1, +1, +1. This cycle has two edges in 4 clock periods so that the number of clock periods having an edge is 50%. The value of the output signal is 3*1+1*−1=2 that is 2/4=50% of maximal so that the maximum input signal level has been reduced to 50% of full scale.

b. When the input signal to the converter is zero: −1, +1, +1, −1. The cycle has again 2 edges in 4 clock periods so that the number of edges having an edge is again 50%. The output is 2*+1+2*−1=0.

c. When the input signal is extreme negative: −1, −1, +1, −1. The cycle has again two edges in 4 clock periods so that the number of clock periods having an edge is 50%. The value of the output signal is 3*−1+1*+1=−2, which is again 50% of maximal negative so that the maximum input signal level has been reduced to 50% of full scale.

These examples clearly show that reduction of the edges result in an increase of the maximum signal level contained in the output signal. This reduction will also give a further reduction in the inter symbol interference generated during the digital to analog conversion of the signal.

The reduced edge digital output signal stream $S_O$, may be applied to any suitable digital signal processor, such as a storage medium represented in FIG. 1 by the compact disc J. The digital signal read from this storage medium is applied to a digital to analog converter K. Any inter-symbol interference generated in the DA converter K is substantially shifted outside the frequency band of interest by the more even distribution of the edges in the digital signal and substantially reduced by the reduction of the average number of edges in this signal.

It may be noted that many modifications on the construction of the edge-density controller G can be made without departing from the scope of the invention. For instance, when the pulses delivered by the edge-extractor E are below zero when no edges occur, the reference voltage source $V_P$ may occasionally be dispensed with. Furthermore, the loop filter N does not have to be an integrator. A second order low pass filter was tried and was found to be functional with better ISI-suppression performance than a first order low pass filter. In the case of a first or second order low pass filter the reference signal $V_P$ may be subtracted from the output signal of the low pass filter instead of from its input signal. The reference signal $V_P$ does not have to be only a DC value. The addition of a time-dependent component to this reference signal makes it possible to widen or lower the spectral output component of the oscillator constituted by the elements Q, M, $P_2$ and G.

In FIG. 1 the invention has been illustrated with an analog sigma-delta modulator and with an analog control circuit. The invention is also applicable with a digital sigma-delta modulator and/or a digital control circuit. In that case the operations such as addition, multiplication, low pass filtering and edge extraction may be done with appropriate digital code.

In the multi-bit sigma-delta converter of FIG. 3 corresponding elements with those of FIG. 1 have been given the same references. The converter of FIG. 3 is intended for directly driving a plurality of one-bit DA-converters. The DA-converters (not shown) are switched by one-bit output signals on the outputs $O_1$, $O_2$, $O_3$ of the multi-bit converter. The input $S_I$ to the converter is a 2-bit digital signal having 4 possible values 0, 1, 2, 3. These values can be restored in analog format by three one-bit DA-converters. Because the references (the current sources) of these DA-converters usually are not exactly equal to each other, non-linear distortion arises during the digital to analog conversion. These errors may be reduced by a method known as "Dynamic Element Matching". By this method each of the analog references is alternately switched into operation for creating each of the analog values.

For this purpose the multi-bit converter of FIG. 3 effectively comprises three one-bit sigma-delta converters, each with its own low pass filter F and with its own quantizer in feedback arrangement with its low pass filter. The three quantizers are combined in a vector-quantizer VQ. The vector-quantizer comprises a controller that is driven by the input signal $S_I$ and that in turn controls each of its quantizers in accordance with the desired DEM-algorithm.

In accordance with the invention each of the one-bit inputs to the vector-quantizer comprises an addition point $P_2$, an edge extractor E, an addition point $P_3$ for the reference value $V_P$, an integrator N and a multiplier M connected as described with reference to FIG. 1. In this manner a multi-bit converter is provided that not only carries out the "dynamic element matching" to cope with the unequal references of the DA-converters, but also reduces the inter-symbol interferences caused by the memory effects inherent in these DA-converters.

The multi-bit converter of FIG. 3 is only given by way of simplified example with 2-bit input signal and 3-bits output. Usually the bit-numbers of input and output signals will be larger with a corresponding larger number of interconnected one-bit sigma-delta converters.

The invention claimed is:

1. A method of reducing inter-symbol interference of a one-bit digital signal stream, the generation of said one-bit digital signal stream comprising the steps of:

converting an input signal to said one-bit digital signal stream with a sigma-delta configuration of a low pass filter having an output coupled to the input of a quantizer whose output is fed back to the input of the low pass filter, characterized by generating a control signal that is representative of the density of the edges of the one-bit digital signal stream at the output of the quantizer, multiplying the control signal with said one-bit digital signal stream and applying the result of the multiplication together with the output of the low pass filter (F) to the input of the quantizer.

2. A one-bit sigma-delta converter for converting an input signal to a one-bit digital signal stream, said converter comprising a quantizer with an input and an output, a low pass filter whose output is coupled to the input of the quantizer and whose input is coupled to the output of the quantizer, thereby constituting a feedback arrangement with the quantizer, means to supply the input signal to the feedback arrangement and means to derive the one-bit digital signal stream from the output of the quantizer, characterized by an edge-density controller connected to the output of the quantizer for providing a control signal indicative of the density of the edges of the one-bit digital signal stream, a multiplier for multiplying said control signal with the one-bit digital signal stream of the quantizer and means for applying the output of the multiplier to the input of the quantizer.

3. A one-bit sigma-delta converter as claimed in claim 2 characterized in that the edge-density controller comprises an edge-extractor connected to receive the one-bit digital signal stream of the quantizer, and a second low pass filter receiving the output signal of the edge-extractor and providing said control signal.

4. A one-bit sigma-delta converter as claimed in claim 3 characterized by a reference signal source connected to the second low pass filter for referencing the level of the control signal.

5. A one-bit sigma-delta converter as claimed in claim 3 characterized in that the second low pass filter is an integrator and that the reference signal is applied with a polarity opposite to that of the edge-extractor pulses to the input of the integrator.

6. A multi-bit sigma-delta converter for converting an input signal to a multi-bit digital signal, said converter comprising said converter comprising:

a plurality of interconnected one-bit sigma-delta converters each with a low pass filter in feedback arrangement with one of a plurality of interconnected quantizer means, means to supply the input signal to said plurality of quantizer means and means to derive the multi-bit digital signal from the outputs of the plurality of quantizer means, characterized in that each of the outputs of the plurality of quantizer means is connected to an edge-density controller for providing a control signal indicative of the edges of the one-bit digital stream at said output, a multiplier for multiplying said control signal with the one-bit digital stream of said output and means for applying the result of the multiplication to the respective input of the quantizer means.

7. A storage medium having stored thereon at least one signal track in one-bit digital stream format, characterized in that the number of clock periods comprising an edge in the one-bit digital stream of said signal track is less than 40% of the total number of clock periods of the one-bit digital stream of said signal track.

* * * * *